Oct. 11, 1966 F. W. CHRISTENSEN 3,277,566

METHODS OF AND APPARATUS FOR METAL-COATING ARTICLES

Filed March 19, 1963 4 Sheets-Sheet 1

INVENTOR
F. W. CHRISTENSEN

BY H. J. Winegar
ATTORNEY

Oct. 11, 1966 F. W. CHRISTENSEN 3,277,566

METHODS OF AND APPARATUS FOR METAL-COATING ARTICLES

Filed March 19, 1963 4 Sheets-Sheet 2

United States Patent Office 3,277,566

Patented Oct. 11, 1966

3,277,566

METHODS OF AND APPARATUS FOR METAL-COATING ARTICLES

Frank W. Christensen, Pennington, N.J., assignor to Western Electric Company, Incorporated, New York, N.Y., a corporation of New York Filed Mar. 19, 1963, Ser. No. 266,244
22 Claims. (Cl. 29—471.1)

This invention relates to methods of and apparatus for coating surfaces of articles with metals and, more particularly, to methods of and apparatus for solder-coating metal surfaces of printed circuit boards and associated electrical component leads.

In the manufacture of electronic equipment, it is common to utilize so-called "printed circuit" boards for interconnecting electrical components into desired electrical circuit arrays. The conventional printed circuit board comprises a supporting, insulating substrate formed of a suitable electrically insulating material, such as a phenol fiber material, glass, ceramic or the like. Formed on one or both sides of the substrate and attached thereto are thin metal circuit paths which are designed to interconnect various electrical components, such as resistors, capacitors, tube sockets and the like. Frequently, holes are punched through the circuit paths and the substrates at predetermined positions to permit the insertion of metal leads of the components, which are subsequently soldered to the metal circuit paths to make electrical connections. These electrical connections must have good electrical conductivity and possess relatively high mechanical strength in order to meet necessary reliability requirements of electronic equipment.

In some mass production processes, the soldering operation is performed after all of the electrical components have been preassembled in their proper positions with the component leads extending through the holes in the printed circuit board and with the end portions of the leads projecting a short distance beyond the circuit paths. The end portions of the leads may be left straight or may be bent over at right angles into contact with the associated circuit paths. The leads projecting from one side of the printed circuit board are then solder-connected to their respective circuit paths by passing the printed circuit board over a wave or fountain of molten solder, e.g., the type disclosed in Dvorak Patent 3,041,991. In the latter type solder is pumped through a nozzle to form a vertical, sheet-like fountain of molten solder. As a printed circuit board is advanced over the solder fountain, the projecting lead ends and the metal circuit paths on the underside of the board contact and are wetted by the solder stream, the metal surfaces and the leads preferably having been pretinned and/or prefluxed in a prior operation so that the solder coats the same and forms solder connections between the circuit paths and the component leads.

The quality of the solder coating and the soldered joints formed in this conventional manner is greatly influenced by the amount and quality of the preconditioning of the metal surfaces preparatory to the solder-coating step. For example, the existence of metallic oxides and other contaminants on the metal surfaces of the circuit paths and component leads can result in poor and unreliable solder connections which lead to subsequent rejection of the finished product or failure of the product under operational conditions. Although extreme care is usually taken to properly precondition the parts to be solder-coated, it is still recognized that it is a difficult problem to insure uniformly the proper degree of cleaniness and freedom from metallic oxides. Other causes of defective coatings and joints include the entrapment of excess flux and gases of decomposition in the holes and spaces between the leads and the circuit paths. The present invention is particularly directed toward a satisfactory and efficacious solution of such problems.

It is an object of this invention to provide new and improved methods of and apparatus for coating surfaces of articles with metals.

It is another object of this invention to provide new and improved methods of and apparatus for solder-coating metal surfaces of printed circuit boards and associated electrical component leads.

Still a further object of this invention is to provide new and improved methods of and apparatus for mass soldering leads of electrical components to metal circuit paths on printed circuit boards to produce high quality, electrically and mechanically soldered connections and joints.

Methods illustrating certain features of the invention may include the steps of generating vibrational energy within the body of a molten metal, maintaining the magnitude and frequency of the energy at a level such as to propagate rapid, compressional oscillations within the molten metal sufficient to cause cavitation and to rupture a localized area of the surface thereof to a degree such that globules of the molten metal are torn loose from the ruptured surface and are caused to impinge upon the article to be coated. By maintaining a predetermined, spaced relationship between the ruptured surface and the article, a substantial number of the globules strike the article while at least in a partially molten condition.

Apparatus illustrating certain features of the invention may include means for forming a body of molten metal and means for generating high frequency, compressional oscillations therewithin, the oscillations being of sufficient intensity and frequency such as to cause severe cavitation and rupture of a free surface of the melt body to a degree such that globules of the molten metal are torn loose from the ruptured surface and ejected into the space above. Means are provided for positioning an article to be metal-coated in the path of the ejected globules.

A complete understanding of the invention may be had from the following detailed description of embodiments thereof, when read in conjunction with the appended drawings, in which.

Figure 1:
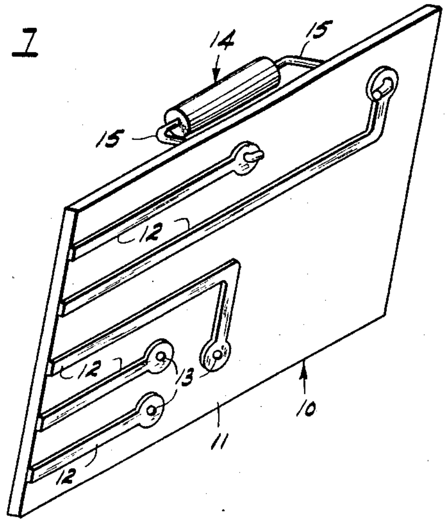
FIG. 1 is a perspective view of a printed circuit board with a prepositioned electrical component.
Figure 2:
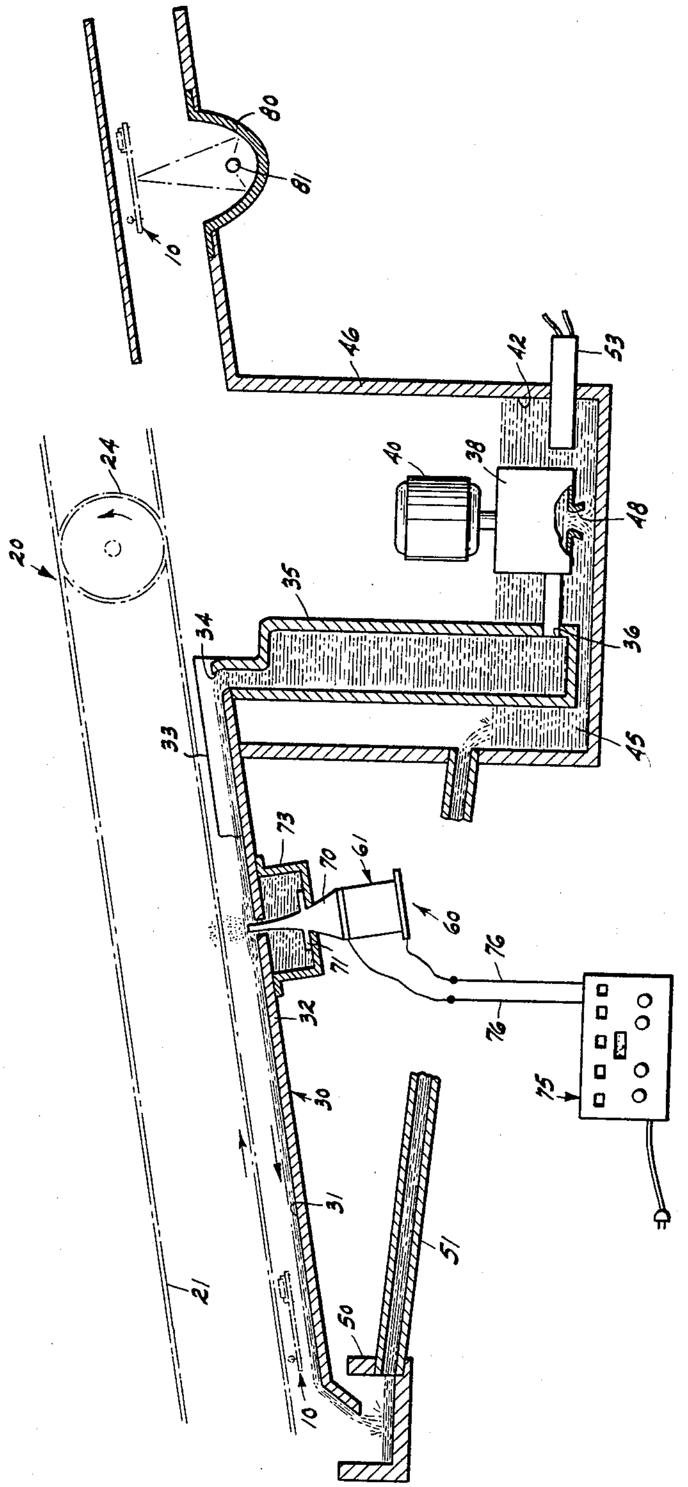
FIG. 2 is a side elevation view of solder-coating apparatus forming one embodiment of the invention, with parts thereof broken away for clarity.

Referring now to the drawings and, in particular, to FIG. 1, there is shown a printed circuit board 10 comprising a supporting substrate 11 of a suitable electrically insulating material, such as a phenol fiber composition, having affixed to the bottom surface thereof a plurality of electrically conductive paths 12—12 formed from a metallic material, such as, for example, copper foil. At predetermined positions on the printed circuit board holes 13—13 have been punched through the substrate 11 and the circuit paths. Electrical components, such as resistors, one of which designated as 14 is shown in FIGS. 1 and 2, have been prepositioned on the printed circuit board 10 by inserting the ends of leads 15—15 through the holes. The ends of the leads 15—15 may be bent over at right angles, as shown in FIG. 1, or left projecting a short distance below the metal surfaces of the circuit paths 12—12. The leads 15—15 on the components are usually "pretinned" prior to insertion, and the metal surfaces of the circuit paths 12—12 are usually preconditioned by a prior cleaning and prefluxing operation using suitable cleaning agents and fluxes. For example, the metal surfaces may be cleaned by using a suitable etchant and subsequently flux-coated with a rosin flux. In some cases, it may be desirable to "pretin" selected areas of the metal circuit paths 12—12 adjacent to the holes.

Figure 3:
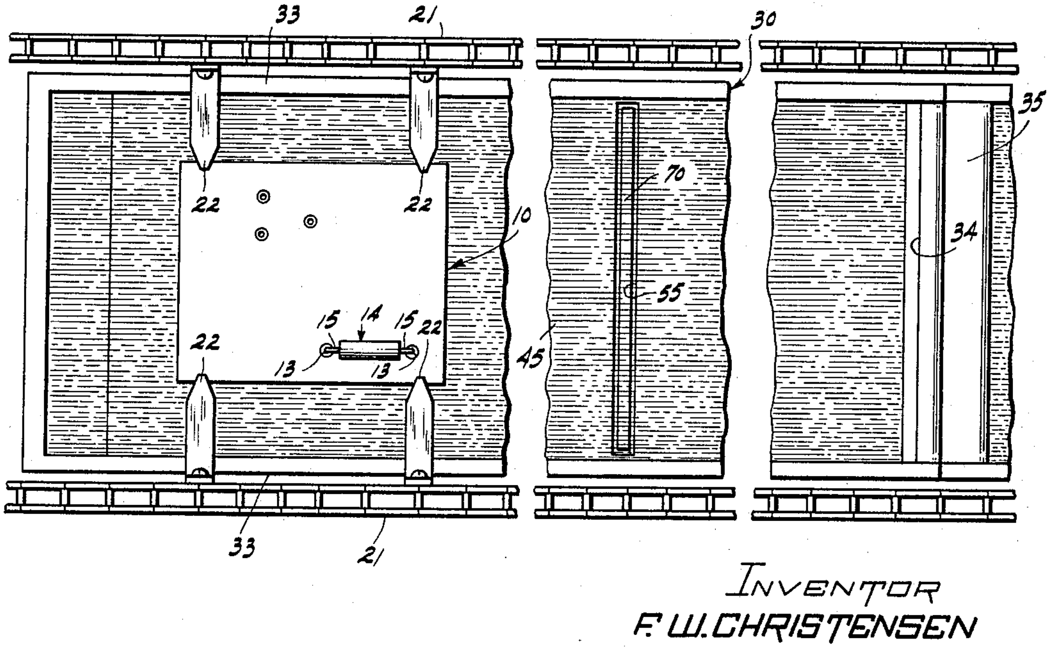
FIG. 3 is a fragmentary plan view of portions of the aparatus illustrated in FIG. 2.

Referring now to FIGS. 2 and 3, there is shown soldering apparatus embodying certain features of the invention for soldering on a mass production basis a series of printed circuit boards 10—10 having the electrical components prepositioned as described above. A conveyor 20 is provided for transporting the boards 10—10 serially through the soldering operation. The conveyor 20 includes a pair of endless chains 21—21 arranged in parallely spaced relationship and provided with suitable holding means, such as spring clips 22—22, for detachably holding the printed circuit boards in the manner disclosed in FIGS. 2 and 3 with a surface of a printed board 10 having circuit paths 12—12 and projecting component leads 15—15 facing downwardly. Drive means, including sprockets 24—24 driven by a constant speed electric drive (not shown), are provided for advancing the boards at a constant, predetermined speed from left to right, as viewed in FIGS. 2 and 3.

Mounted beneath the conveyor 20 is an inclined trough 30 having a channel 31 which is formed by a bottom member 32 and a pair of upwardly extending side members 33—33 formed integrally therewith. The trough 30 is inclined at an angle with respect to the horizon, for example, 15°. The bottom member 32 and side members 33—33 of the trough 30 are made of a suitable heat-resistant metal, such as cast steel, which is not wet by solder. Communicating with the upper end of the channel 31 is a discharge opening 34 of a manifold 35. An inlet opening 36 is provided at the lower end of the manifold 35 and is connected to the discharge of a conventional gear pump 38 driven by an electric motor 40. The pump 38 is at least partially submerged in a reservoir 42 of molten solder 45 contained within a tank 46. An inlet 48 of the pump 38 is spaced a short distance above the bottom of the tank to permit molten solder to be sucked into the pump and forced through the outlet thereof into the manifold 35 when the motor 40 is energized.

The pump 38 has a capacity sufficient to force the molten solder 45 into the manifold 35 and through the discharge opening 34 at a flow rate sufficient to produce in the channel 31 a continuously flowing stream of molten solder 45 of a predetermined, constant depth. The molten solder 45 issuing from the discharge opening 34 of the manifold 35 flows down the inclined channel 31 and is discharged at the lower end of the channel into a catch basin 50 from which the molten solder is returned by gravity to the reservoir 42 in the tank 46 through an interconnecting conduit 51.

Suitable means are provided for heating and melting the solder in the tank and for maintaining the temperature of the molten solder at a preselected value. The heating means may be, for example, an electric heater element 53 projecting through the wall of the tank 46 into the reservoir 42. A conventional thermostatic controller (not shown) is provided for regulating the temperature of the molten solder 45. It may be seen that, when the motor 40 is energized, molten solder 45 is continuously circulated from the reservoir 42 through the manifold 35, along the channel 31 and back to the reservoir. The temperature of the molten solder stream, as well as the depth, are preset by making proper adjustments to the thermostatic controller and by controlling the speed of the motor.

Figures 4, 5:
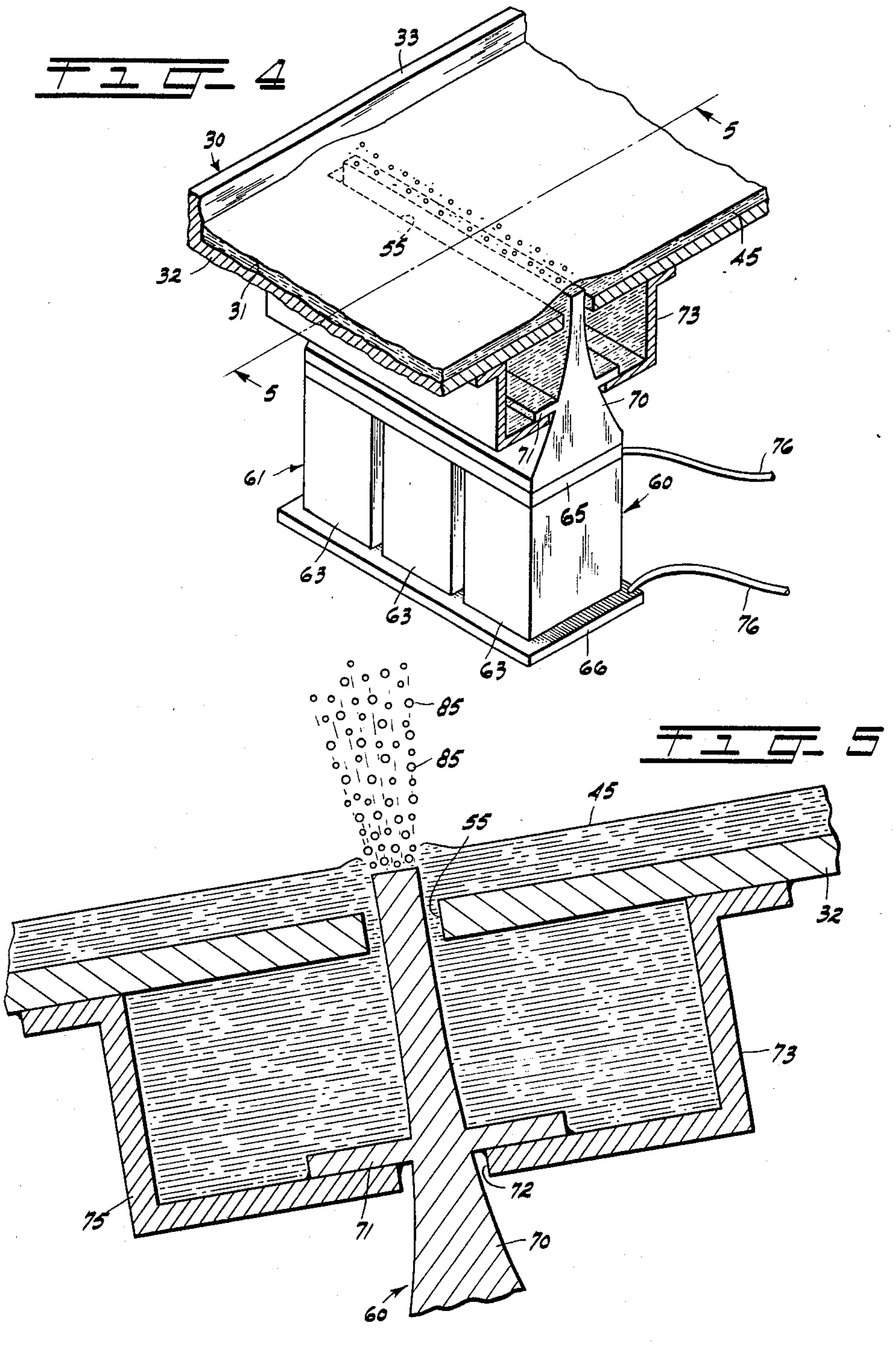
FIG. 4 is a fragmentary perspective view of portions of the apparatus shown in FIG. 2, illustrating, in particular, an electromechanical transducing array and transformer forming a part of the apparatus.
FIG. 5 is an enlarged vertical section taken along line 5—5 of FIG. 4, illustrating certain design and operational features of the apparatus of FIG. 2.

A section of the bottom member 32 intermediate the ends thereof is provided with a generally rectangular opening 55 extending transversely from one side to the other. The opening is designed to receive an electromechanical transducing array, designated generally by the numeral 60 and shown in detail in FIG. 4. The electromechanical transducing array 60 comprises a transducer bank 61 composed of a plurality of identical, closely spaced blocks 63—63 of a suitable piezoceramic material, for example, barium titanate or the like. The piezoceramic blocks 63—63 are arranged so as to be connected in electrical and mechanical parallel. Fixed to the coplanar upper and lower surfaces of the piezoceramic blocks 63—63 are thin metal layers 65 and 66. Bonded to the upper layer 65 is a velocity transformer 70 made of metal or some other suitable elastic material of relatively high tensile strength, for example, stainless steel or the like, which will not be wet by the molten solder 45. The transformer 70 may be rectangular in cross section, as illustrated in FIG. 4, and may be tapered, the cross sectional area decreasing, typically catenoidally, toward the free end thereof. The length of the transformer 70 is equal to an integral number of half wavelengths in the frequency of the vibrating system. To facilitate mounting a flange 71 is provided on the transformer 70 ¼ wavelength from the free end, i.e., the flange is positioned at a nodal point. The flange 71 is secured adjacent to the edges of a mounting opening 72 formed in a concave pan 73, which in turn is secured about the opening 55 in the bottom member 32 and forms a sump-like depression in the channel 31.

As best shown in FIG. 5, the free end of the transformer 70 extends through the opening 55 in the bottom member 32 and is spaced a predetermined distance on opposite sides thereof from the corresponding sides of the opening. Clearances are also provided at the opposite ends of the transformer 70 adjacent to the side members 33—33. As shown in FIG. 3, the transformer 70 extends transversely across the entire width of the channel 31 except for the small clearances provided at either side between the free end of the transformer and the side members 33—33. The depth of the molten solder stream flowing in the channel 31 is regulated by controlling the speed of the motor 40 driving the pump 38 so the free end of the transformer 70 is submerged to a predetermined depth below the quiescent surface of the molten solder 45.

A high frequency, electronic oscillator 75 is connected electrically by lines 76—76 to the layers 65 and 66, respectively, of the bank 61 of piezoceramic blocks 63—63, which as previously described are connected in electrical parallel. The oscillator 75 is fed from a 60-cycle, 110-volt alternating source. The design of the oscillator 75 is conventional, the major requirement being that it be capable of supplying an input signal of a predetermined high frequency to the transducer bank 61 at a sustained, predetermined power level.

The electromechanical transducing array 60 is similar to a crystal-driven system disclosed in Mason Patent 2,514,080, which discloses typical design requirements and operational characteristics. It will be understood that magnetostrictive transducers might be employed in place of the piezoceramic transducers. In operation, when the bank 61 of piezoceramic blocks 63—63 is energized with the high frequency input signal from the oscillator 75, the lengths of the piezoceramic blocks 63—63 alternately lengthen and shorten. This cyclic motion is imparted to the transformer 70 to cause it to vibrate in its longitudinal mode.

Near the right hand end of the apparatus, as viewed in FIG. 2, there is positioned a reheating station which includes an elongated reflector 80 having an elliptical cross section. The reflector is mounted below and transversely with respect to the path of travel of the printed circuit boards 10—10 transported by the conveyor 20. The interior surface of the reflector 80 is silvered or otherwise highly polished to efficiently reflect light energy, predominantly in the infrared wavelengths, emitted by a suitable infrared light source 81 located along a transversely extending first focal line of the elliptical cross sectioned reflecting surface. Because of the elliptical cross section of the reflector, infrared energy is focused and concentrated along a transversely extending second focal line. By design, the spacing between the lower surfaces of the advancing printed circuit boards with respect to the second focal line of focused infrared rays is such as to cause the lower surfaces to intercept the plane containing the first and second focal lines at the second focal line or immediately adjacent thereto, the intense, concentrated rays of infrared energy resulting in the rapid heating of the metal surfaces of the leads 15—15 and circuit paths 12—12 on the bottom sides of the boards 10—10. By suitable selection of the infrared source, the operation conditions thereof and the speed of the conveyor 20, sufficient heat is developed to remelt solder adhering to these metal parts and permit a uniform redistribution of the solder.

In the operation of the embodiment shown in FIGS. 2, 3, 4 and 5, the molten solder 45 in the tank 46 is brought to a predetermined optimum temperature by suitable control of the heater element 53. For example, when a 50/50 tin-lead solder alloy, having a melting point of about 420° F., is used, this temperature is maintained automatically at about 450° F. Due to the relatively high circulation rate of molten solder 45 through the apparatus, the thermal gradient within the flow throughout is relatively low. If required, extra heater elements may be provided in the pan 73. The motor 40 is energized and runs at a constant speed so as to force molten solder 45 through the outlet opening 34 at a rate sufficient to maintain a predetermined depth of approximately .100 inch of molten solder covering the free end of the transformer 70 when the oscillator 75 is not operating. After these conditions have been established, the oscillator 75 is turned on so as to cause high frequency, longitudinal, compressional oscillations in the transformer 70.

The generated vibratory energy is concentrated at the free end of the transformer 70 and transmitted to the relatively shallow column of molten solder 45 which is instantaneously positioned above the flat, upper surface of the free end. The cyclic lengthening and shortening of the transformer 70 generates alternate compression and rarefaction waves in the molten solder 45. The transmitted energy is adjusted to a predetermined frequency and supplied at an energy level sufficient to result in the violent cavitation of the molten solder 45 in the region of the free end of the transformer 70, the rupture of the surface of the molten solder, and the emission of small globules 85—85 of molten solder from the stream surface into the space immediately above at relatively high velocities. In effect, the molten solder 45 immediately above the free end of the transformer is transformed into a violently percolating liquid in the region immediately adjacent to the transformer from which a cloud of molten solder globules 85—85 issue at relatively high velocities, the solder globules normally falling back into the channel.

In one exemplary working embodiment the oscillator 75 is operated at approximately 20 kc. with a power input of about 300 watts for a transformer 70 having a transverse width (measured transversely across the width of the trough) of 3 inches and a thickness at its terminus of .1 inch (measured along the longitudinal axis of the trough), giving a distribution of 100 watts per linear inch of transformer width and 1,000 watts per square inch of the upper surface of the free end of the transformer. Under the latter operating conditions the excursions of the free end of the transformer 70 had an amplitude of approximately .00002 inch. In this exemplary working embodiment the solder globule sizes ranged from infinitestimally small diameters up to approximately .0006 to .0008 inch in diameter.

The conveyor 20 is started to transport the individual circuit boards 10—10 from left to right, as viewed in FIG. 2, in the manner previously described. The path of the advancing boards 10—10 is such that the lower surfaces move parallel to and in close proximity to the hot surface of the molten solder stream flowing down the channel 31. As the boards 10—10 advance, the metal circuit paths 12—12 and component leads 15—15 are heated by the molten solder due to convection and radiation from the hot surface of the stream of molten solder 45. The length of travel of the boards 10—10 over the flowing molten solder 45 at the predetermined speed is made sufficient to cause the metal of the circuit paths 12—12 and component leads 15—15 to be preheated to substantially the temperature of the molten solder, for example, about 420° F. or slightly above in the example given. Auxiliary preheating means (not shown) may be provided to accomplish this end, for example, a unit substantially identical to the unit at the infrared reheating station can be employed advantageously for this purpose.

Figure 6:
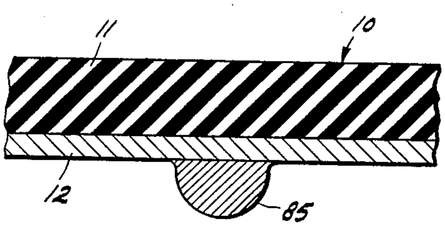
FIG. 6 is a greatly enlarged, fragmentary, vertical section of a printed circuit board, illustrating a solder droplet which has wet and adhered to a metal circuit path on the board.

As the printed circuit boards 10—10 continue to advance the lower surfaces thereof intercept the cloud of solder globules 85—85 issuing from the violently percolating region of molten solder 45 immediately above the free end of the transformer 70. In the exemplary working embodiment, the spacing between the lower surfaces of the boards and the free end of the transformer by design is such that a substantial proportion of the globules 85—85 strike the metal surfaces of the circuit paths 12—12 and component leads 15—15 while still possessing relatively high velocities. For example, the globules have a velocity of Mach 1 upon breaking free from the surface of the molten solder stream and immediately prior to striking the metal surfaces of the circuit paths, which are spaced approximately .4 inch above the free end of the transducer 70, still possess velocities of the order of Mach 0.1 on the average. Because of the relatively high energy with which the rapidly moving globules 85—85 strike the metal surfaces of the circuit paths 12—12 and component leads 15—15, the solder globules are able to penetrate oxide films and other foreign contaminants which may cover these metal surfaces and make good, strongly adherent fusion bonds with these surfaces. In particular, those solder globules 85—85 which reach the metal surfaces in a hot, plastic condition are exceptionally well suited to breaking the brittle oxide films that may cover the base metal of the circuit paths 12—12 and component leads 15—15. As best shown in FIG. 6, these hot, plastic globules 85—85 flatten out upon impact, are reheated by the relatively hot, preheated metal surfaces of the circuit paths 12—12 and leads 15—15, and wet and adhere to these surfaces.

At a spacing of .4 inch between the bottom surface of a board 10 and the upper surface of the free end of the transformer 70 in the exemplary working embodiment, it is found that a major portion of the globules 85—85 are in a hot, plastic condition immediately prior to striking the heated metal surfaces of the circuit paths 12—12 and component leads 15—15. It is observed that these hot, plastic globules upon striking the heated metal surfaces pick up sufficient heat therefrom to remelt, wet the surfaces and adhere thereto, as shown in FIG. 6. In the exemplary working embodiment satisfactory solder coatings were obtained at spacings up to 1.5 inches, but a spacing of .5 inch is considered the maximum for optimum coating conditions. As this spacing is increased, the percentage of hot, plastic globules 85—85 impinging upon the metal surfaces of the circuit paths 12—12 and component leads 15—15 decreases and, accordingly, the above-described beneficial action attributed to the hot, plastic globules decreases.

After passing through the cloud of solder globules 85—85, the metal surfaces of the circuit paths 12—12 and component leads 15—15 are coated with solder. Because of the manner in which the coating is formed, this coating may be fairly pebbly or frosty in appearance and it may be desirable to reheat the thus coated surfaces to improve the distribution, appearance and quality of the solder coating. The reheating is advantageously accomplished at the infrared reheating station.

As the printed circuit boards are advanced through the infrared reheating station, the focused infrared rays rapidly bring the solder-coated metal surfaces to a temperature somewhat above the melting point of the solder and the solder remelts and flows to redistribute itself into a uniform, smooth coating on the metal surfaces. Manifestly, other means might be employed to reheat the solder coating, for example, superheated streams of inert gases may be employed.

Although an oscillator frequency of 20 kc. has been utilized in the example, other frequencies may be employed, for example, frequencies ranging from about 60 cycles to 150 kc. might be employed. Preferably, frequencies above the sonic range, i.e., 20,000 cycles per second, are employed, particularly to keep the sound energy generated from creating undesirable noise.

It will be understood that suitable masks may be employed for masking a portion of the metal surfaces on the printed circuit boards 10—10 where it is desired that certain portions be kept solder-free.

Figure 7:
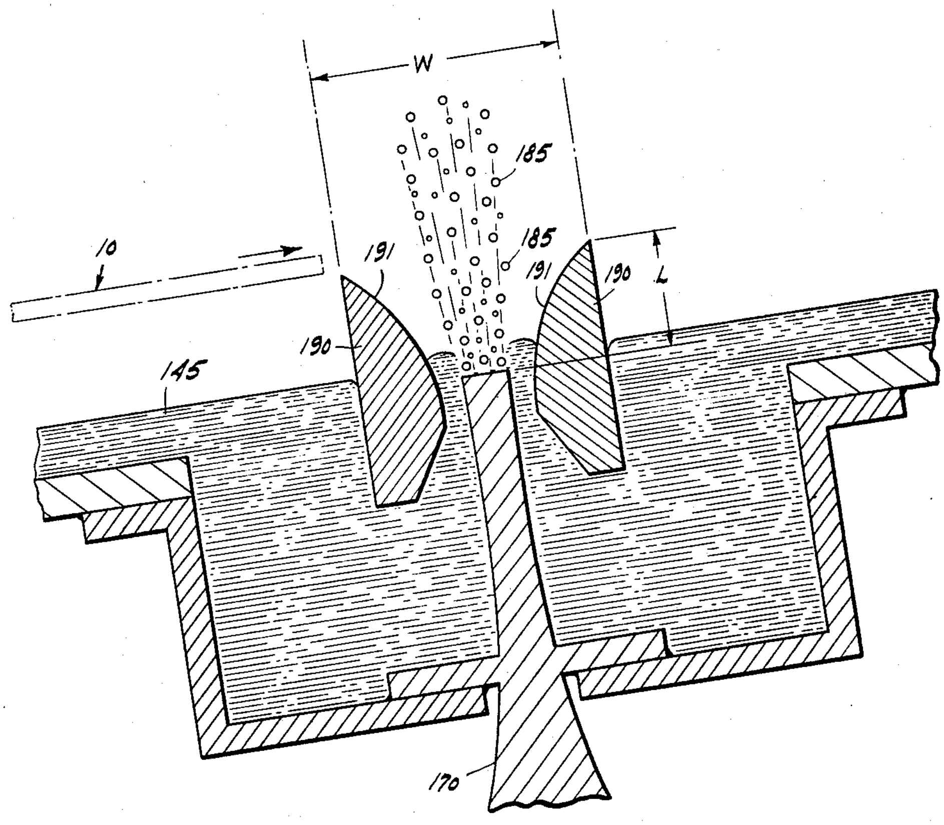
FIG. 7 is a vertical, sectional view taken along with the longitudinal axis of another embodiment of the invention.

Referring now to FIG. 7, there is illustrated apparatus forming another embodiment of the invention. This apparatus is similar to the apparatus previously described and includes a transformer 170, which may be identical to the transformer 70 in structure and manner of mounting. As in the first-described embodiment, the free end of the transformer 170 extends transversely across the entire width of the channel except for small clearances provided between it and side members of the trough.

Positioned adjacent the upstream and downstream sides of the free end of the transformer 170 are a pair of spaced, parallely disposed, transversely extending baffle members 190—190 made of stainless steel or other suitable, non-wettable, heat resistant material. As shown in FIG. 7, the baffle members 190—190 cooperate to form a horn-like enclosure for the extremity of the free end of the transformer 170. The opposing walls 191—191 of the baffle members 190—190 are spaced from the sides of the free end of the transformer 170. This spacing must be at least great enough to permit the free flow of solder between the walls and the sides of the transformer, but for optimum results should be kept as small as feasible. Under conditions similar to those disclosed in connection with the above-described exemplary working embodiment, the spacing was such as to provide a minimum clearance of the order of .1 inch.

As shown in FIG. 7, the walls 191—191 are contoured to provide a cantenoidally cross sectioned space therebetween, the optimum shape under the circumstances to provide an optimum impedance match between the transformer and the air. Referring to FIG. 7, the optimum dimensions of the space are a width (W) at the exit equal to ½ wavelength in air at the operating frequency of the transformer and a length (L) of ½ wavelength in air at the operating frequency. It will be understood that the cross sectional shape of the space enclosed by the baffle members 190—190 might also vary exponentially or at a constant taper angle. However, the catenoid configuration is considered to represent an optimum for impedance matching.

The baffle members 190—190 extend transversely the entire width of the channel and are mounted fixedly at their opposite ends to the side members of the trough. The bottoms of the baffle members 190—190 are spaced from the bottom member and the upper surfaces of a pan member to permit molten solder to flow freely therebetween. As in the first-described exemplary embodiment, the free end of the transformer 170 is submerged beneath the quiescent surface of the solder stream and, under the conditions similar to the example heretofore described, is submerged to a depth of approximately .1 inch when the transformer is not energized. In operation, the molten solder from a sump-like depression beneath the horn-like enclosure is "pumped" to the free end of the transformer 170 through the clearances between the free end thereof and the baffle members 190—190 as a result of the high frequency, mechanical oscillations when the generator unit is operating.

With the transformer 170 energized, the solder-coating operation is substantially identical to that of the first-described embodiment. However, the provision of the specially designed horn-like enclosure provides an optimum impedance match permitting a markedly more efficient utilization of the energy transmitted by the transformer 170 to the molten solder 145 for producing the desired high density cloud of solder globules 185—185 through which the printed circuit boards are passed in the manner heretofore described in detail.

The term "solder," as employed in the specification and claims, is meant to include suitable metals and metal alloys having relatively low melting points, such as lead, lead-tin alloys, and the like. For soldering and otherwise coating metal surfaces on printed circuit boards, it is desirable that the melting point of the solder be well below temperatures which would harm the substrate materials used in the printed circuit board. Of course, it is a fundamental requirement that the metal or metal alloy employed be capable when molten of wetting and adhering to the metal to be coated. The term "metal," as employed in the specification and claims, is meant to include metal alloys as well as base metals.

The term "free surface," as used in the specification and claims, is meant to describe the normal interface of the stream of molten metal with the ambient, gaseous atmosphere, e.g., air or an inert gas, or a partial vacuum, when the stream is in a quiescent flowing condition, i.e., undisturbed by compressional oscillations.

It is to be understood that the above-described embodiments are merely illustrative of the principles of the inventions. Other embodiments may be devised by persons skilled in the art which embody these principles and fall within the spirit and scope thereof.

What is claimed is:

1. The method of coating articles with a metal, which comprises:

melting a metal to form a body of melt, continuously circulating the melt over an open channel, generating compressional oscillations within the melt circulating in the open channel of sufficient energy to cause severe cavitation within a localized region of the melt to an extent that a free surface of the melt is ruptured and globules of molten metal break off from the ruptured surface and are ejected into the space above, and placing an article to be coated in the paths of the ejected globules so that said globules impinge upon a surface of the article.

2. The method according to claim 1 wherein the article is a printed circuit board having metal circuit paths fixed to the surface thereof, the metal is a solder capable of wetting said metal circuit paths, and the body of melt is caused to circulate over the open channel in a stream of predetermined depth.

3. The method of solder-coating metal surfaces on printed circuit boards, which comprises:
melting a solder to form a body melt;
circulating the melt over an open channel to expose a free surface of the melt;
generating within the melt in the open channel high frequency, compressional oscillations in a direction having a component directed toward and perpendicular to said free surface;
sustaining said oscillations at an energy level sufficient to cause severe cavitation within a region of the melt immediately below the free surface so that the surface of the melt is ruptured and globules of solder are ejected at high velocities into the space above to form a fountain-like cloud; and
placing the face of a printed circuit board having metal surfaces thereon above the ruptured surface of the melt in the path of the solder globules leaving the melt so that the globules impinge upon the metal surfaces of the printed circuit board, wet and adhere thereto.

4. The method according to claim 3 wherein the oscillations are of a frequency within the range from about 60 cycles to 150 kilocycles per second.

5. The method according to claim 3 wherein the metal circuit paths are preheated to at least the melting point of the solder and a predetermined spacing is maintained between the surface of the printed circuit board and the normally free surface of the melt, the spacing being such that a substantial proportion of the globules striking the metal circuit paths are in a hot, plastic condition and are reheated upon contacting the metal circuit paths so as to at least partially remelt, wet and adhere to the metal circuit paths.

6. The method of solder-coating metal surfaces on printed circuit boards, which comprises:
melting a solder capable of wetting the metal of said metal surfaces when molten, to form a body of melt;
continuously circulating the melt over an open channel;
generating high frequency, compressional oscillations;
transmitting said oscillations to a localized region within the melt in the open channel by means of a transformer vibrating in a mode such that the high frequency, compressional vibrations produce shock waves moving in a direction having a component perpendicular to a free surface of the melt;
sustaining said oscillations at an energy level sufficient to cause severe cavitation, rupturing of a limited area of the free surface of the melt immediately adjacent to the terminus of the transformer and the ejection of molten globules of solder therefrom; and
placing the face of a printed circuit board having metal surfaces thereon above the ruptured surface of the melt in the path of the ejected globules so that the globules impinge upon said metal surfaces, wet and adhere thereto.

7. The method according to claim 6 including the step of preheating the metal surfaces of the printed circuit board.

8. The method according to claim 6 wherein the metal surfaces are preheated to at least a temperature substantially equal to the melting point of the solder and the spacing maintained between said metal surfaces and the normally free surface of the melt is such that a substantial proportion of the globules are in a hot, plastic condition as the globules strike the metal surfaces, such globules being at least partially remelted by contact with said heated metal surfaces so as to wet and adhere thereo.

9. The method according to claim 8 including the additional step of reheating the solder-coated metal surfaces above the liquidius point of the solder to distribute the solder coat evenly over the metal surfaces.

10. The method of coating metal surfaces, which comprises:
melting a metal to form a body of melt, the metal being capable when molten of wetting and adhering to a metal surface to be coated;
continuously circulating the melt over an open channel;
rupturing the melt in the channel at a free surface thereof so as to tear off molten globules therefrom and projecting the globules toward the metal surface to be coated; and
maintaining the spacing between the free surface of the melt and metal surface to be coated at a distance such that a substantial proportion of the globules strike the said metal surface at relatively high velocities and while in a hot, plastic condition capable of breaking through metal oxide and contaminant films on said metal surface and wetting and adhering thereto.

11. The method according to claim 10 which comprises the additional step of preheating said metal surface to at least the melting point of the coating metal.

12. Apparatus for metal-coating articles, which comprises:
means for containing a body of molten metal;
means for circulating the molten metal over an open channel;
means for generating high frequency, compressional oscillations within the molten metal in the open channel, said oscillations being of sufficient intensity and frequency as to cause severe cavitation, rupture of a free surface of the molten metal and ejection of globules of the metal into the space above; and
means for positioning an article to be metal-coated in contact with said ejected metal globules.

13. Apparatus for solder-coating metal surfaces on printed circuit boards, which comprises:
means for melting solder;
an inclined open trough;
means for pumping molten solder into the open trough to create a flowing stream of solder;
means for generating high frequency, compressional shock waves at a localized region within the stream of solder, said shock waves being of sufficient intensity and frequency to cause severe cavitation and rupture of the free surface of the stream in said localized region to a degree such that globules of the molten solder are ejected into the space above; and
means for moving a printed circuit board above the surface of the stream so that said globules of solder strike the metal surfaces on the board, wet and adhere thereto.

14. Apparatus according to claim 13 wherein said generating means includes a mechanical transmission line for introducing high frequency oscillations to the molten solder, said transmission line extending through the bottom of the trough into the solder stream and terminating a short distance below the free surface of the stream.

15. Apparatus for solder-coating metal surfaces on printed circuit boards, which comprises:
means for forming a body of the melt;
means for circulating the melt over an open channel;
means for generating within the melt in the open channel high frequency, compressional oscillations in a direction having a component directed toward and perpendicular to a free surface of the melt, said generating means sustaining the oscillations at an energy level sufficient to cause severe cavitation within a region of the melt immediately adjacent to the free surface so that the surface of the melt is ruptured and globules of solder are ejected at relatively high velocities into the space above to form a fountain-like cloud of solder globules; and
means for positioning a printed circuit board above the ruptured surface of the melt with metal surfaces thereon in the path of the solder globules leaving the melt so that the solder globules impinge upon the metal surfaces, wet and adhere thereto.

16. Apparatus according to claim 15 wherein the oscillations are of a frequency within a range from about 60 cycles to 150 kilocycles per second.

17. Apparatus in accordance with claim 16 wherein the means for positioning the printed circuit board is designed to maintain a predetermined spacing between the surface of the melt and the metal surfaces on the board, said spacing being such that a substantial proportion of the solder globules impinging upon said metal surfaces are in a hot, plastic condition.

18. Apparatus in accordance with claim 17 including means for preheating the metal surfaces on the printed circuit board to at least the melting point of the solder.

19. Apparatus in accordance with claim 18 including means for reheating the solder-coated metal surfaces of the printed circuit board to the melting point of the solder.

20. Apparatus for solder-coating metal surfaces on printed circuit boards, which comprises:

means for melting solder;

an open trough;

pumping means for continuously supplying molten solder to the open trough to form a continuously flowing stream of a predetermined depth;

means for generating high frequency, mechanical oscillations;

a velocity transformer connected at one end to said generating means and having its free end projecting through the bottom of the open trough into the flowing stream of molten solder, said oscillations causing the cyclic lengthening and shortening of the transformer to generate alternate compressional and rarefaction waves in the molten solder;

means for maintaining said oscillations at an energy level sufficient to cause the rupture of the free surface of the solder stream immediately adjacent to the free end of the transformer and the ejection of globules of solder into the space above to form a fountain-like cloud of globules; and means for positioning a printed circuit board above the ruptured surface of the molten solder stream with metal surfaces on the board interposed in the path of the solder globules leaving the stream so that said globules impinge upon the metal surfaces, wet and adhere thereto.

21. Apparatus according to claim 20 including a pair of baffle members mounted in spaced relationship on opposite sides of the free end of the transformer to form a horn-like, impedance-matching enclosure.

22. Apparatus for solder-coating articles having solderable, metal surfaces, which comprises:

a trough having a channel for receiving molten solder;

pumping means for continuously supplying molten solder to the trough to form a continuously flowing stream of a predetermined depth in the channel;

means for generating high frequency, mechanical oscillations;

a velocity transformer coupled at one end to said generating means and having its free end projecting through the bottom of the trough into the flowing stream of molten solder in the channel, the free end being normally submerged in the stream of molten solder and said oscillations causing the cyclic lengthening and shortening of the transformer to propagate alternate, high frequency, compressional and rarefactional waves within a localized region of the molten solder;

a pair of baffle members mounted in the trough on upstream and downstream sides, respectively, of the free end of the transformer to form a horn-like enclosure thereabout;

means for maintaining said oscillations at an energy level sufficient to cause the rupture of the free surface of the solder stream immediately adjacent to the free end of the transformer and the ejection of globules of solder into the space above to form a fountain-like cloud of globules; and means for positioning an article having a metal surface to be solder-coated above the ruptured surface of the molten solder stream with the metal surface interposed in the paths of the solder globules leaving the stream so that the globules impinge upon the metal surface, wet and adhere thereto.

References Cited by the Examiner

UNITED STATES PATENTS

| | | | |
|---|---|---|---|
| 2,469,392 | 5/1949 | Jones et al. | 29—503 |
| 2,512,743 | 6/1950 | Hansell | 118—300 |
| 2,514,080 | 7/1950 | Mason | 73—71.5 |
| 2,671,264 | 3/1954 | Pessel | 29—503 X |
| 3,039,185 | 6/1962 | Oates | 29—503 |
| 3,041,991 | 7/1962 | Dvorak | 29—503 X |
| 3,084,650 | 4/1963 | Johns | 29—503 X |

FOREIGN PATENTS

| | | |
|---|---|---|
| 846,961 | 9/1960 | Great Britain. |

JOHN F. CAMPBELL, *Primary Examiner.*